United States Patent
Peh et al.

(10) Patent No.: US 7,115,428 B2
(45) Date of Patent: Oct. 3, 2006

(54) METHOD FOR FABRICATING LIGHT-EMITTING DEVICES UTILIZING A PHOTO-CURABLE EPOXY

(75) Inventors: Thomas Kheng Guan Peh, Penang (MY); Chien Chai Lye, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 43 days.

(21) Appl. No.: 11/075,242

(22) Filed: Mar. 7, 2005

(65) Prior Publication Data

US 2006/0199293 A1 Sep. 7, 2006

(51) Int. Cl.
*H01L 21/00* (2006.01)

(52) U.S. Cl. .................. 438/26; 438/106; 438/126; 438/795

(58) Field of Classification Search ............ 438/22–46, 438/106–127, 795–799
See application file for complete search history.

(56) References Cited

U.S. PATENT DOCUMENTS

| | | | |
|---|---|---|---|
| 5,905,012 A * | 5/1999 | De Meutter et al. ......... | 430/124 |
| 6,806,658 B1 * | 10/2004 | Tan et al. .................... | 315/291 |
| 2003/0001140 A1 * | 1/2003 | Starkey ................. | 252/301.35 |
| 2004/0018379 A1 * | 1/2004 | Kinlen ........................ | 428/690 |
| 2004/0166234 A1 * | 8/2004 | Chua et al. ................... | 427/64 |
| 2004/0212295 A1 * | 10/2004 | Chua et al. ................. | 313/503 |

\* cited by examiner

*Primary Examiner*—Savitri Mulpuri

(57) ABSTRACT

A method for fabricating a light-emitting device is disclosed. A die that includes a semiconductor light emitting device is mounted on a carrier, the die having a face through which light is emitted. A mixture of photocurable epoxy and phosphor particles is dispensed on the face in a pattern that covers the face. The dispensed mixture is then irradiated with light to cure the epoxy in a time period that is less than the time period in which the phosphor particles settle. In one embodiment, the photocurable epoxy includes a UV curable epoxy. In one embodiment, the die includes sides through which some of the light is emitted and the mixture is allowed to run down the sides prior to being irradiated.

3 Claims, 3 Drawing Sheets

METHOD FOR FABRICATING LIGHT-EMITTING DEVICES UTILIZING A PHOTO-CURABLE EPOXY

BACKGROUND OF THE INVENTION

For the purposes of the present discussion, the present invention will be discussed in terms of a "white" emitting light-emitting diode (LED); however, the methods taught in the present invention can be applied to wide range of LEDs. A "white emitting LED" is an LED that emits light that is perceived by a human observer to be "white". Such sources can be constructed by making an LED that emits a combination of blue and yellow light in the proper ratio of intensities. High intensity blue-emitting LEDs are known to the art. Yellow light can be generated from the blue light by converting some of the blue photons via an appropriate phosphor. In one design, a transparent layer containing dispersed particles of the phosphor covers an LED chip. The phosphor particles are dispersed in a potting material that surrounds the light-emitting surfaces of the blue LED. To obtain a white emitting LED, the thickness and uniformity of the dispersed phosphor particles must be tightly controlled.

In one class of prior art LEDs, the phosphor layer is fabricated by a molding process that utilizes a liquid mold compound that has the phosphor particles dispersed therein. The liquid mold compound is applied to a die having an LED thereon. The mold compound is then cured in place to provide the layer of phosphor particles. In one design, the LED is mounted on a heat sink in a well in a printed circuit board base. The well has reflective sides that form a reflective "cup" having the LED chip at the bottom thereof. The phosphor is mixed with a liquid casting epoxy and injected into the cup. The mixture is then heat-cured for 2 hours.

Unfortunately, this manufacturing system has a poor yield due to uneven phosphor dispersion in the reflecting cup. The density of the phosphor particles is greater than that of the liquid casting epoxy, and hence, the particles tend to settle toward the bottom of the reflector cup during the curing period. As a result, the amount of phosphor over the chip is reduced, which, in turn, lowers the ratio of yellow to blue light generated by the completed device. Such a device emits light that is bluish-white rather than white.

SUMMARY OF THE INVENTION

The present invention includes a method for fabricating a light-emitting device. A die that includes a semiconductor light-emitting device is mounted on a carrier, the die having a face through which light is emitted. A mixture of photo-curable epoxy and phosphor particles is dispensed on the face in a pattern that covers the face. The dispensed mixture is then irradiated with light to cure the epoxy in a time period that is less than the time period in which the phosphor particles settle. In one embodiment, the photocurable epoxy includes a UV curable epoxy. In one embodiment, the die includes sides through which some of the light is emitted and the mixture is allowed to run down the sides prior to being irradiated.

DETAILED DESCRIPTION OF THE PREFERRED EMBODIMENTS OF THE INVENTION

Figure 1:
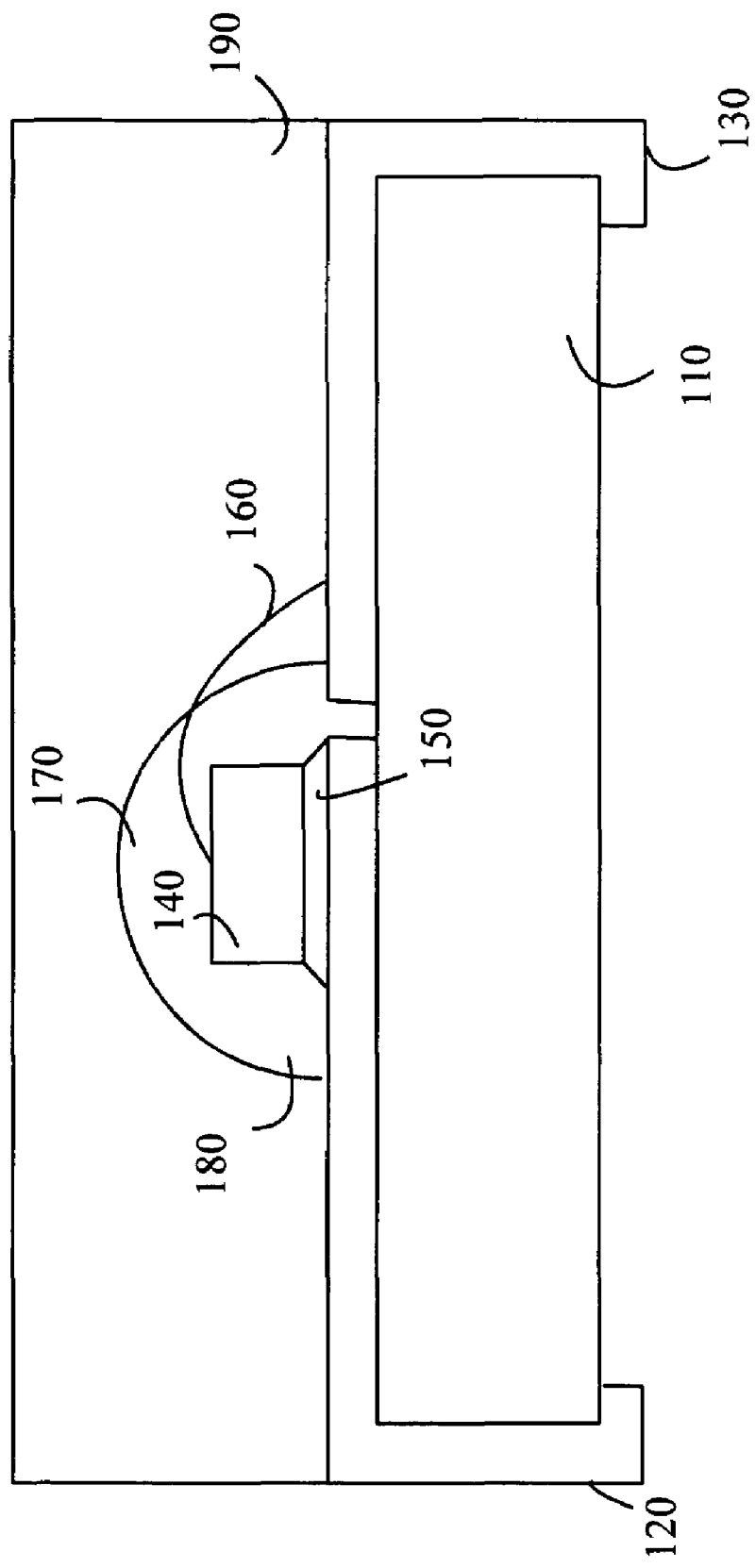
FIG. 1 is a cross-sectional view of a prior art LED device 100 that is constructed on a substrate 110 with at least two terminals for supplying power to the device.

The manner in which the present invention provides its advantages can be more easily understood with reference to FIG. 1, which is a cross-sectional view of a prior art LED device 100. LED device 100 is constructed on a substrate 110 with at least two terminals for supplying power to the device. Exemplary terminals are shown at 120 and 130. In the embodiment shown in FIG. 1, an LED 140 is mounted on the first terminal 120 using an adhesive layer 150. LED 140 has one power terminal on the bottom surface of the LED and the other on a bond pad on the top surface. Adhesive layer 150 is constructed from an electrically conducting adhesive, and hence, provides an electrical connection to the power terminal on the bottom of the LED. A wire 160 that is typically connected using a conventional wire bonding process provides the power connection between the second terminal 130 and LED 140. A first encapsulant 170 containing phosphor particles 180 is dispensed around the LED. A second encapsulant 190 then seals the first encapsulant.

As noted above, in one class of prior art devices, the phosphor-containing encapsulant is typically produced by mixing the phosphor particles with the first encapsulant, which is typically an epoxy-based material. This mixture is then placed in a reservoir and dispensed over the LEDs using a dispensing tool such as a syringe. The mixture in the reservoir can be stirred to prevent the phosphor particles from settling. However, once the epoxy mixture is dispensed, phosphor particles tend to settle under gravity during the period between the dispensing of the epoxy on the die and the time the epoxy is cured. In general, the epoxy is applied to a large number of devices over a first period of time. After all of the devices have been covered, the devices are transferred to an oven for curing. Hence, the time available for the particles to settle can be quite long.

Figure 2:
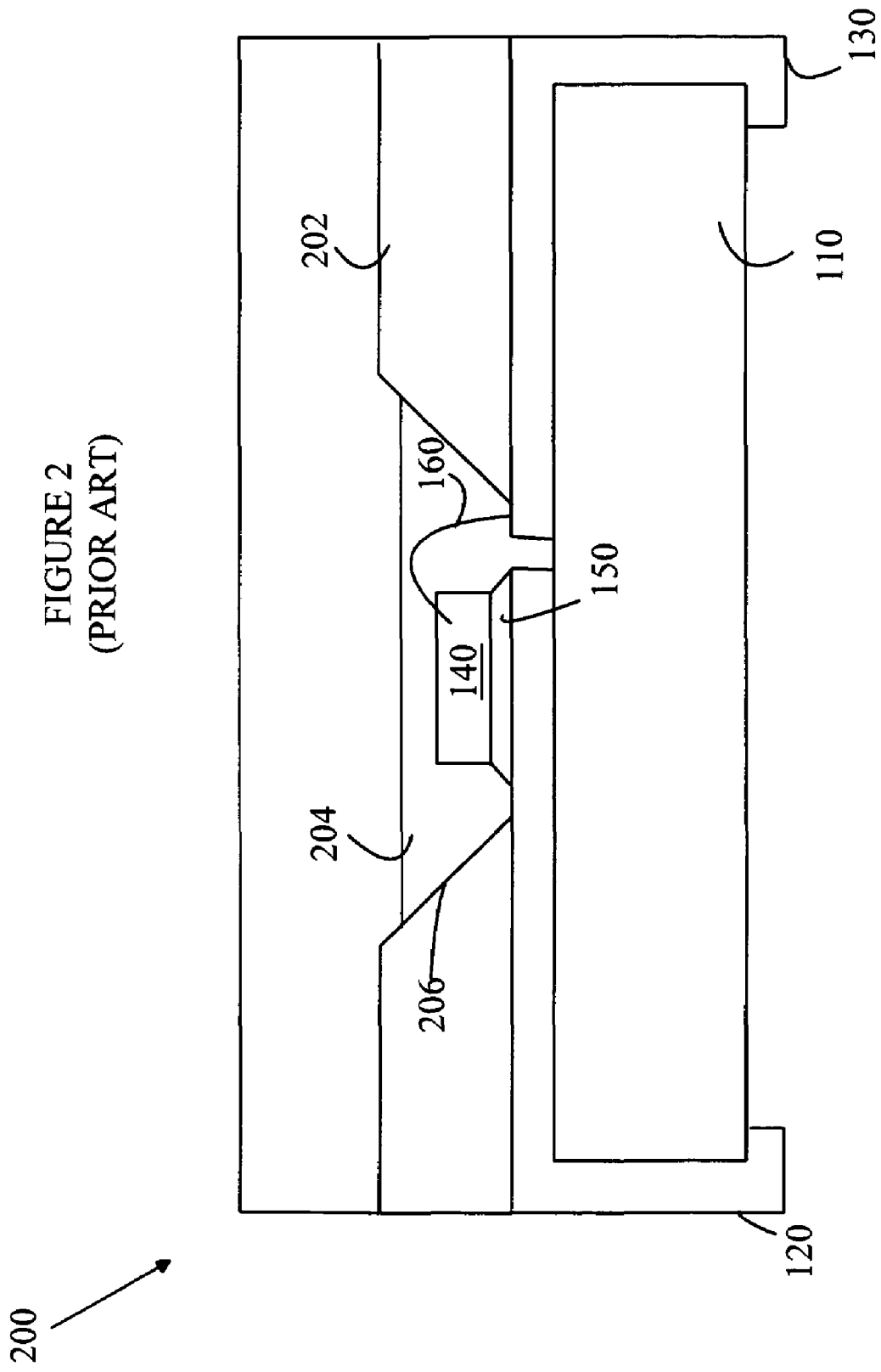
FIG. 2 illustrates a prior art light source that utilizes a reflective cup as a mold.

In addition, unless some form of mold is provided, the viscous epoxy-phosphor layer will slump during this time interval, and hence, the amount of material over the various chips will vary depending on the point in time that each device was covered. This later problem can be substantially reduced by including a reflective cup or some other structure that acts as a mold to define the thickness of the epoxy layer. Such an embodiment is shown in FIG. 2, which is a cross-section of a prior art device 200 that utilizes a reflective cup 206 in a substrate 202 to direct light leaving the side of LED 140 into the forward direction. This cup also acts as a mold for defining the thickness of the phosphor layer 204. While this scheme reduces the problems associated with the epoxy mass changing shape between the time it is dispensed and the time the epoxy is cured, the problems associated with the settling of the phosphor particles remain. In addition, the amount of epoxy-phosphor mixture needed per device is relatively large, since the areas to the side of LED 140 must also be filled with the mixture. While the cost of the epoxy is relatively low, the cost of the additional phosphor material and other agents contained in the mixture can be significant. In addition, the costs associated with the reflecting cup or other mold can also be significant in many applications.

The present invention substantially reduces this settling problem by utilizing a UV curable epoxy to reduce the curing time. In the present invention, the phosphor is mixed with the UV curable epoxy and then dispensed on the dies using a dispensing syringe. A short time after a layer of epoxy-phosphor mixture is dispensed on a die, the layer is exposed to UV light to cure the epoxy before the epoxy has time to run off of the die or substantially change shape. The time interval between dispensing and UV exposure is set such that any irregularities in the layer resulting from the dispensing operation have time to even out.

Figure 3C:
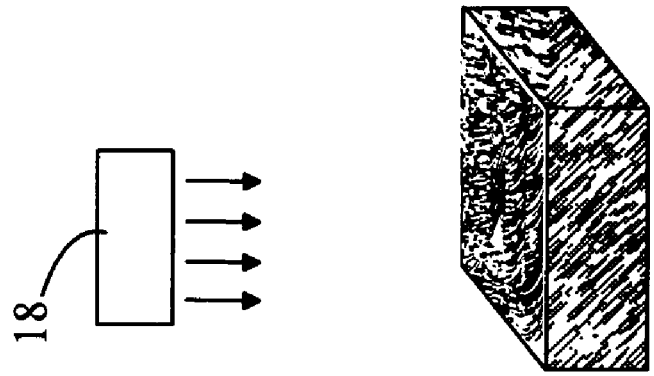
FIGS. 3A–3C illustrate the manner in which the present invention applies a phosphor conversion layer to a die.
Figure 3B:
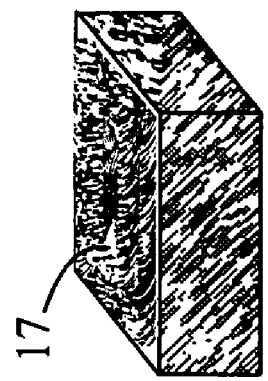
Figure 3A:
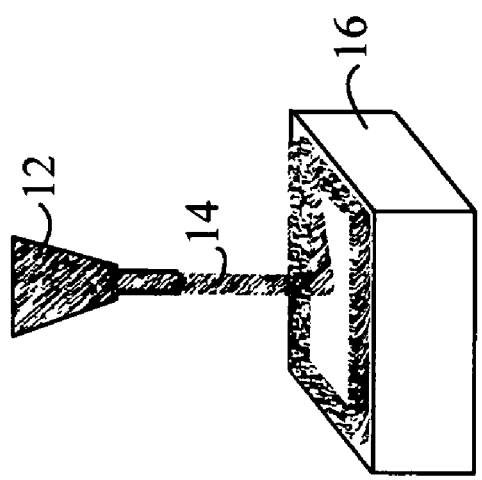

Refer now to FIGS. 3A–C, which illustrate the manner in which the epoxy-phosphor mixture is dispensed in one embodiment of the present invention. Referring to FIG. 3A, the epoxy-phosphor mixture is applied to the LED-containing die 16 from a dispenser 12 that dispenses a bead of epoxy mixture 14. The relative positions of dispenser 12 and die 16 are altered to provide a pattern that substantially covers the surface of the die. After the pattern has been completed, the epoxy can be allowed to sit for a short period of time to allow the epoxy to even out and cover any small areas such as area 17, shown in FIG. 3B, that have not been completely covered by the epoxy mixture. In addition, some of the epoxy flows down the sides of the die and covers the edges of the die during this settling period. After this settling period, the epoxy-coated die is exposed to a UV light source 18, shown in FIG. 3C, for a short period of time.

In one embodiment, the viscosity of the epoxy mixture was between 2000 and 3000 cps. In one exemplary dispensing operation, a tray having 480 dies that were connected to the substrates containing the lead frames was processed one die at a time. The entire dispensing phase required less than 1 second for each die. The mixture was allowed to set for approximately 1 second while the dispensing head moved between dies. The epoxy was then subjected to the UV irradiation for approximately 1 second while the dispensing apparatus moved to the next die. The time to coat all 480 dies was less than 10 minutes, and hence, any settling of the phosphor particles in the dispenser was negligible.

The present invention can be used with a large variety of phosphors. For example, phosphors based on aluminum garnets such a Yttrium Aluminum Garnet (YAG:Ce); YAG:Ce,Pr; YAG:Ce, Tb; Terbium Aluminum Garnet (TAG:Ce); Silicate phosphor (Ba,Ca,Sr)SiO4; the sulfides such as Strontium Sulfide (SrS) and thiogallates such as Strontium Thiogallate ($SrGa_2S_4$) may be utilized. Such phosphors are provided in the form of particles ranging from 1 μm to 30 μm and they have various shapes. Suitable phosphors are commercially available from Osram, Philips, or General Electric. It should also be noted that certain phosphors such as SrS or $SrGa_2S_4$ are moisture sensitive in that their wavelength conversion ability deteriorates upon prolonged exposure to moisture, and hence, must be protected from moisture. The phosphor component of the epoxy mixture is typically in the range of 0 to 35 percent by weight.

If the phosphor composition is sensitive to moisture, the epoxy-phosphor composition can also advantageously include a hydrophobic agent to protect the phosphor particles from moisture. The hydrophobic agent is typically present in a concentration of less than 3 percent by weight. For example, liquid silicon wax can be used to modify the compatibility and wettability of inorganic material surfaces with the organic (epoxy) resin.

While the above-described embodiments of the present invention utilized specific phosphors and epoxy compositions, the present invention may be practiced with numerous other epoxy and phosphor compositions. In particular, any phosphor material that is capable of converting light emitted from an LED into visible light may be utilized. The phosphor material can be a phosphor which is capable of converting and emitting one color (broadband, narrow band or multi-line e.g. red, green, blue, yellow or white), or a mixture of phosphors which are capable of converting and emitting different colors to provide a desired output spectrum.

For example, the epoxy-phosphor composition of the present invention can be used with an LED capable of generating UV and/or blue light to generate white-appearing light. In this case, the phosphor material converts such UV and/or blue light into visible white light. In particular, light having a wavelength in the range, between 400 to about 800 nm. The phosphor material is desirably provided in the form of particles, which can be intermixed within the epoxy composition.

Various modifications to the present invention will become apparent to those skilled in the art from the foregoing description and accompanying drawings. Accordingly, the present invention is to be limited solely by the scope of the following claims.

What is claimed is:

1. A method for fabricating a light emitting device comprising:
   mounting a die comprising a semiconductor light emitting device on a carrier, said die having a face through which light is emitted;
   dispensing a bead of a mixture of photo curable epoxy and phosphor particles on said face in a pattern that covers said face; and
   irradiating said dispensed mixture in a time period that is less than the time period in which said phosphor particles settle wherein said time period is less than 1 second.

2. The method of claim 1 wherein said die further comprises sides through which some of said light is emitted and wherein said dispensed mixture is allowed to run down said sides of said die prior to being irradiated.

3. The method of claim 1 wherein said photo curable epoxy comprises a UV curable epoxy.

* * * * *